US009865939B2

(12) United States Patent
Luukkainen et al.

(10) Patent No.: US 9,865,939 B2
(45) Date of Patent: Jan. 9, 2018

(54) CONNECTING ELEMENT WITH A SPRING TAB

(71) Applicant: Microsoft Technology Licensing, LLC, Redmond, WA (US)

(72) Inventors: Marko Luukkainen, Jyskä (FI); Tuomas Marttila, Tampere (FI); Tero Pekka Knuuttila, Tampere (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/018,830

(22) Filed: Feb. 8, 2016

(65) Prior Publication Data

US 2017/0229791 A1    Aug. 10, 2017

(51) Int. Cl.
*H05K 9/00* (2006.01)
*H01R 4/48* (2006.01)
*H01R 13/24* (2006.01)

(52) U.S. Cl.
CPC ....... *H01R 4/4809* (2013.01); *H01R 13/2442* (2013.01)

(58) Field of Classification Search
CPC .......... H01R 13/65802; H01R 13/6596; H01R 13/652; H01R 9/37; H05K 9/0016; H05K 1/0218
USPC .............. 439/817, 95, 96, 101; 174/354; 361/753; 257/785
See application file for complete search history.

(56) References Cited

U.S. PATENT DOCUMENTS

| | | | | |
|---|---|---|---|---|
| 3,504,095 A | * | 3/1970 | Roberson | H05K 9/0016 |
| | | | | 174/355 |
| 4,061,413 A | * | 12/1977 | Keller | H01R 4/64 |
| | | | | 174/351 |
| 4,383,724 A | * | 5/1983 | Verhoeven | H01R 31/08 |
| | | | | 439/510 |
| 4,416,497 A | | 11/1983 | Brandsness et al. | |
| 4,780,570 A | * | 10/1988 | Chuck | H05K 9/0016 |
| | | | | 174/369 |

(Continued)

FOREIGN PATENT DOCUMENTS

| | | |
|---|---|---|
| EP | 2398114 A1 | 12/2011 |
| WO | 0122788 A1 | 3/2001 |

OTHER PUBLICATIONS

"Spring Fingers", Retrieved on: Nov. 18, 2015, 6 pages.

(Continued)

*Primary Examiner* — Hae Moon Hyeon

(57) ABSTRACT

A connecting element for galvanically connecting two electrically conductive surfaces, comprises: a body plate having a body plate upper surface defining a body plate top level; and a spring tab extending from the body plate and having a spring tab upper surface comprising an upper contact section above the body plate top level. The connecting element has a connecting element bottom level, and the spring tab has a spring tab lower surface comprising a lower contact section, the spring tab having a rest position in which, with no external force applied onto the upper contact section, the lower contact section lies above the connecting element bottom level, and is bendable, by applying external force onto the upper contact section, to a compressed position in which the lower contact section lies in or below the connecting element bottom level.

19 Claims, 5 Drawing Sheets

(56) References Cited

U.S. PATENT DOCUMENTS

| | | | | |
|---|---|---|---|---|
| 5,043,528 | A * | 8/1991 | Mohr | H05K 9/0016 |
| | | | | 174/355 |
| 5,467,254 | A * | 11/1995 | Brusati | H05K 7/1409 |
| | | | | 174/355 |
| 5,563,450 | A | 10/1996 | Bader et al. | |
| 5,681,190 | A * | 10/1997 | Childs | H01R 13/11 |
| | | | | 439/842 |
| 5,747,735 | A | 5/1998 | Chang et al. | |
| 5,856,632 | A * | 1/1999 | Bostrom | H05K 9/0016 |
| | | | | 174/354 |
| 6,276,947 | B1 | 8/2001 | Homfeldt et al. | |
| 6,290,513 | B1 * | 9/2001 | Kakinoki | G06K 7/0047 |
| | | | | 439/108 |
| 6,362,425 | B1 | 3/2002 | Chilton et al. | |
| 6,485,314 | B1 * | 11/2002 | Stahl | H01R 4/64 |
| | | | | 439/108 |
| 6,519,817 | B1 | 2/2003 | Lenhart et al. | |
| 6,538,197 | B1 * | 3/2003 | Kawai | H05K 9/0016 |
| | | | | 174/359 |
| 7,247,053 | B2 * | 7/2007 | Yamagata | H01R 12/58 |
| | | | | 439/607.53 |
| 7,576,993 | B2 | 8/2009 | Hsieh et al. | |
| 7,692,932 | B2 * | 4/2010 | Bisbikis | G06F 1/182 |
| | | | | 174/350 |
| 7,845,993 | B2 * | 12/2010 | Falchetti | H01R 13/113 |
| | | | | 439/843 |
| 7,901,221 | B1 | 3/2011 | Li et al. | |
| 8,043,098 | B2 * | 10/2011 | Huang | H05K 9/0067 |
| | | | | 439/95 |
| 8,434,951 | B2 | 5/2013 | Wittenberg et al. | |
| 9,093,234 | B2 | 7/2015 | Lynch et al. | |
| 2002/0176240 | A1 | 11/2002 | Hudson et al. | |
| 2005/0271848 | A1 | 12/2005 | Kitchin et al. | |
| 2006/0105640 | A1 | 5/2006 | Vance | |
| 2007/0052100 | A1 * | 3/2007 | Bellinger | H01R 4/48 |
| | | | | 257/758 |
| 2013/0286582 | A1 | 10/2013 | Dabov et al. | |
| 2014/0233170 | A1 | 8/2014 | Hobson et al. | |

OTHER PUBLICATIONS

"Fold Over Sub Series", Omega Shielding Products, Retrieved on: Feb. 2, 2016, 4 pages.

"International Search Report and Written Opinion Issued in PCT Application No. PCT/US2017/015702", dated Mar. 24, 2017, 12 Pages.

* cited by examiner

CONNECTING ELEMENT WITH A SPRING TAB

BACKGROUND

In various electronic devices, such as portable or mobile devices, electrical connections are required between different parts, components, or elements of the device. In some applications, such contacts may be made by using various types of connecting elements sometimes called, for example, grounding clips, grounding springs, grounding elements, or spring fingers. Such connecting element may comprise a body part and a bendable or flexible spring tab or spring finger. With such connecting element, a galvanic contact between two conductive surfaces may be achieved during assembly of a device by first placing the connecting element onto one of the surfaces to be connected, and then bringing the other surface into contact with the spring tab of the connecting element.

The design and structure of the connecting element and the spring tab thereof may affect the process of forming the electrical contact as well as the quality and reliability of the formed contact.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A connecting element, which may be called an electrical connecting element, is disclosed which may be used for galvanically connecting two electrically conductive surfaces, for example, for grounding or shielding purposes or for forming a signal or power supply path. The connecting element may comprise a body plate having a body plate upper surface defining a body plate top level, and a spring tab extending from the body plate and having a spring tab upper surface comprising an upper contact section above the body plate top level. The connecting element may have a connecting element bottom level, and the spring tab may further have a spring tab lower surface comprising a lower contact section. The spring tab may have a rest position or rest state in which, with no external force applied onto the upper contact section, the lower contact section of the spring tab lower surface lies above the connecting element bottom level, and the spring tab may be bendable, by applying external force onto the upper contact section towards the connecting element bottom level, to a compressed position or compressed state in which the lower contact section lies in or below the connecting element bottom level.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein:

In FIGS. 1 to 11, the connecting elements and the connecting assembly are illustrated as schematic drawings. The drawings are not in scale. The method of FIG. 13 is illustrated as a flow chart.

DETAILED DESCRIPTION

The detailed description provided below in connection with the appended drawings is intended as a description of a number of embodiments and is not intended to represent the only forms in which the embodiments may be constructed, implemented, or utilized.

Figure 1:
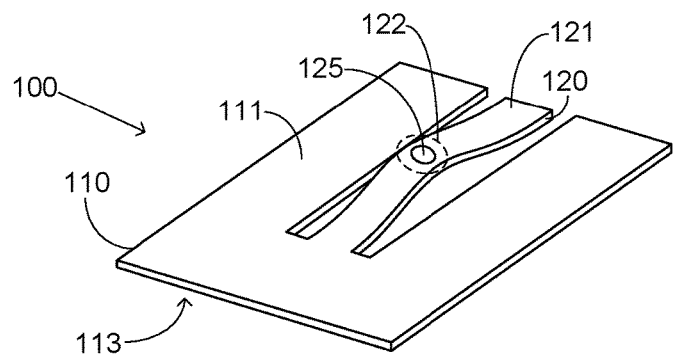
FIG. 1 illustrates a connecting element.
Figure 2A:
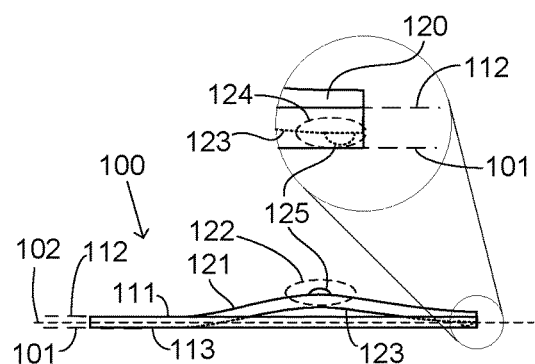
FIGS. 2A and 2B illustrate alternative views and details of the connecting element of FIG. 1.
Figure 2B:
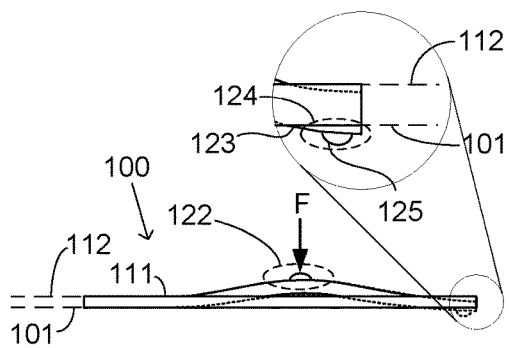

The connecting element 100 of FIG. 1, shown as a simplified perspective view, comprises a body plate 110 and a spring tab 120 extending from the body plate. The spring tab could be alternatively called, for example, "spring finger". In FIGS. 2A and 2B, the same connecting element is illustrated as a side view showing the cross-sectional or side profile of the connecting element.

"Extending" from the body plate refers to the spring tab 120 being joined to the body plate and continuing the overall structure of the connecting element outside the body plate. The body plate 110 and the spring tab 120 of the connecting element 100 of FIG. 1 may be integral parts of the connecting element formed as one single solid body. For example, the spring tab may be formed by cutting or stamped it partially apart from a body plate so that a connection remains between the body plate and the spring tab, and bending the thereby formed spring tab preform according to the desired profile thereof. In another embodiment, it may be possible to have an initially separate spring tab attached to a body plate.

The body plate 110 may be substantially planar, and it extends along, i.e. is directed so as to be parallel with, a fictitious connecting element principal plane 102 marked in FIG. 2A.

The body plate 110 has a body plate upper surface 111 which, as illustrated in FIGS. 2A and 2B, defines a body plate top level 112 which represents the maximum extent of the body plate upwards. The body plate further has a body plate lower surface 113 which, in the connecting element of FIG. 1, defines a connecting element bottom level 101 representing the maximum extent of the whole connecting element downwards.

The spring tab 120 has a spring tab upper surface 121 comprising an upper contact section 122 which, as illustrated in FIGS. 2A and 2B, lies above the body plate top level 112. This is implemented by the spring tab having a curved cross-sectional profile elevating the spring tab from the body plate. The spring tab further has a spring tab lower surface 123 comprising a lower contact section 124.

"Contact section" refers to a point, area, or portion on a spring tab surface, via which a galvanic contact may be formed between the spring tab and an external, electrically conductive surface brought into contact with the contact section. With the spring tab comprising both the upper contact section 122 and the lower contact section 124, electrical connection may be formed between two electrically conductive surfaces via the spring tab alone, without any need to form a direct galvanic contact between the body plate and any of the two electrically conductive surfaces. The body plate may be attached to one of the surfaces to be contacted by, for example, an adhesive which is not needed to be electrically conductive.

"Galvanic" contact refers to a physical contact providing electrons carrying an electric current with a continuous, non-interrupted, electrically conductive propagation path between the contacted surfaces. Thus, for example, when propagating through a galvanic contact, electrons do not need to cross an air cap or propagate through an electrically insulating layer or structure. Correspondingly, "galvanically connecting" refers to connecting two electrically conductive surfaces so that a galvanic contact is formed between them.

As illustrated in the drawings of FIGS. 1, 2A, and 2B, the spring tab top and lower surfaces 121, 123 may comprise a contact bump 125 in the upper contact section 122 and/or in the lower contact 124 section, respectively. Such contact bump then forms the uppermost and/or the lowermost point of the spring tab upper and lower surfaces, respectively. In another embodiment, the upper and/or lower contact section(s) may be flat, without any protruding bump.

A contact bump may make the actual contact area of the contact section smaller in comparison with a contact section without a contact bump. Then, the force by which the contact section and the surface to be contacted are pressed together, with the connecting element in use in a connecting assembly, is applied on a smaller area. Such small-area contact bump may mechanically wear the surface which it contacts and/or remove or decrease the effects of possible impurities on the surface. This may improve the reliability of the galvanic contact between the spring tab and the surface.

The spring tab 120 is flexibly bendable between a rest position, illustrated in FIG. 2A, and a compressed position, illustrated in FIG. 2B. In the rest position, when no external force is applied onto the upper contact section 122 of the spring tab, the lower contact section 124 with the bump 125 thereon lies slightly above the connecting element bottom level. This may facilitate positioning and attachment of the connecting element 100 on a mounting surface, such as an electrically conductive surface to be electrically connected to another electrically conductive surface, by that no force is applied by the spring tab to the mounting surface. This may improve the accuracy of positioning the connecting element. On the other hand, it may relieve the requirements of the attachment between the mounting surface and the connecting element, for example, allowing use of an adhesive with a lower qualification and performance.

The spring tab is bendable from the rest position to the compressed position, for example, by applying, as illustrated in FIG. 2B, external force F onto the upper contact section towards the connecting element bottom level. As illustrated in FIG. 2B, with the spring tab 120 in its compressed position, the lower contact section 124 with the contact bump 125 therein defining the lowermost position section of the spring tab lower surface 123, lies below the connecting element bottom level 101.

In another embodiment, the connecting element may be configured to have the lower contact section, with the spring tab in its compressed position, at the connecting element bottom level, thus without extending below that level. In general, with the spring tab in its compressed position, the lower contact section is thus lowered, with relative to the rest position, at least to the connecting element bottom level.

When in use, the spring tab may also be bent or forced to any intermediate position between the rest and the compressed positions, wherein the lower contact section may lie lower than when the spring tab is in its rest position but higher than when the spring tab is in its compressed position.

Said extending of the lower contact section 124, with the spring tab in its compressed position, in or below the connecting element bottom level 101 may enable the lower contact section 124 of the spring tab lower surface 123 to contact an electrically conductive surface on which the connecting element is attached when in use. The connecting element as illustrated in FIGS. 1, 2A and 2B may be attached on an electrically conductive surface by means of an adhesive, which may be applied on such surface, or on the body plate lower surface, as a continuous adhesive layer or as one or more discrete adhesive pads. The adhesive may define an interspace between the body plate and the surface onto which it is attached. Alternative, there may be recess downwards on the electrically conductive surface below the spring tab. Then, for contacting said surface, the lower contact section of the spring tab lower surface may, with the spring tab in its compressed position, extend below the connecting element bottom level defined by the body plate lower surface.

An "electrically conductive surface" refers to a surface having at least an electrically conductive region or portion which the lower contact section may contact, with appropriate location of the connecting element, when the spring tab is in its compressed position. Such surface may be, for example, coated by an electrically insulating layer having an opening for contacting the electrically conductive surface by the lower contact section of the spring tab.

Figure 3:
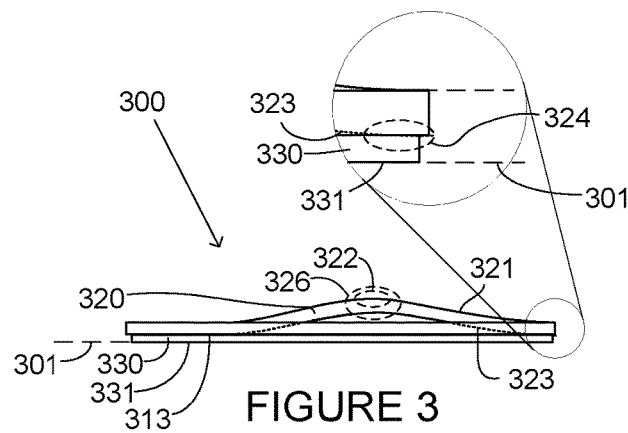
FIG. 3 illustrates another connecting element.

In another embodiment, illustrated in FIG. 3, the connecting element 300 further comprises, as a part of it, an adhesive layer 330 attached to the body plate lower surface 313. The adhesive layer has a free lower surface 331 opposite to another surface thereof lying against the body plate lower surface 313. In this embodiment, the free lower surface 331 of the adhesive layer 330 defines the connecting element bottom level 301. In this embodiment, it may be sufficient for the lower contact section 324 of the spring tab lower surface 323 to reach, with the spring tab in its compressed position, the connecting element bottom level 301 without extending below that level. With the connecting element 300 attached on an electrically conductive surface by the adhesive layer 330, the connecting element bottom level coincides with the electrically conductive surface. Then, the lower contact section 324 in that connecting element bottom level may contact the electrically conductive surface and form a galvanic contact between it and the spring tab.

Apart from the adhesive layer, the connecting element 300 may be in accordance with the connecting element of FIGS. 1, 2A, and 2B. In a modification of the connecting element of FIG. 3, there may be contact bump(s) in the spring tab upper and/or lower contact section.

The term "spring" in the context of the spring tab refers to spring-like nature of the spring tab. Namely, the spring tab is flexible or bendable in the sense that it may be reversibly deflected or deformed, as described above, using external force applied onto the upper contact section, from the rest position to the compressed position, but it tends to return to the rest position when such external force is no more applied. Thus, as in any spring element, upon deflecting the spring tab from its rest position, a counteracting spring force is generated in the spring tab structure, tending to return the spring tab to its rest position. The spring property may be achieved as an inherent property of the spring tab profile shape and the material thereof.

The term "connecting element" refers to the capability of the connecting element to serve for electrical connecting by forming a galvanic connection between two electrically conductive surfaces. The connecting element may be made of any material with suitable electrical conductivity. For example, the connecting element may be made of one or more metals, such as aluminum or copper or any other suitable metal. The connecting element may comprise any suitable plating, such as gold plating, possibly enhancing the contact properties of the connection element surfaces or, for example, protecting the same from oxidizing.

Figure 4:
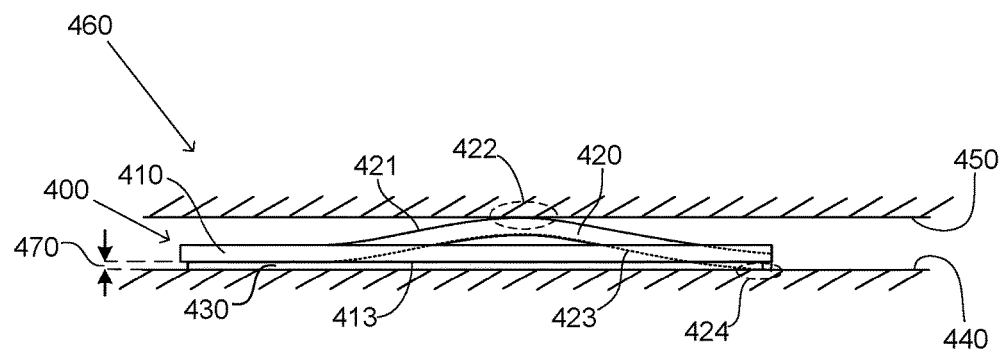
FIG. 4 illustrates a connecting assembly.

The connecting assembly 460 of FIG. 4 comprises a first electrically conductive surface 440, a second electrically conductive surface 450, and a connecting element 400 positioned between the first and the second electrically conductive surfaces. The connecting element 400, which may be, for example, in accordance with any of the connecting elements of FIG. 1, 2A, 2B (except of the contact bumps), and FIG. 3, comprises a body plate 410 which is attached on the first electrically conductive surface 440, separated therefrom by an interspace 470. In the connecting assembly illustrated in FIG. 4, the interspace is defined by an adhesive layer 430 which may be attached or otherwise formed in advance onto the body plate lower surface 413, similarly to the connecting element of FIG. 3. Alternatively, the adhesive layer may be attached or otherwise formed in advance onto the first electrically conductive surface 440. In yet another alternative, instead of forming or attaching the adhesive layer in advance, the adhesive layer may be formed by applying an adhesive on the body plate lower surface 413 and/or on the first electrically conductive surface during assembling the connecting assembly.

The connecting element has a spring tab 420 which may be, for example, in accordance with any of the spring tabs of the connecting elements of FIGS. 1, 2A, 2B (except of the contact bumps), and 3. The spring tab comprises an upper contact section 422 and a lower contact section 424 on its upper and lower surfaces 421, 423, respectively.

The second electrically conductive surface 450 is located with relative to the first electrically conductive surface 440 and the connecting element 400 attached thereto so that it contacts the upper contact section 422 of the spring tab 420 and compresses the spring tab so as to force the lower contact section 424 to contact the first electrically conductive surface 440. The spring tab 420 is thus forced to its compressed position. Simultaneously, the spring force of the spring tab continuously forces the upper contact section 422 against the second electrically conductive surface 450. Thereby, the spring tab 420 may form a secure galvanic connection between the first conductive surface 440 and the second conductive surface 450.

In another embodiment, a connecting assembly may comprise a connecting element in accordance with the connecting element of FIGS. 1, 2A, and 2B, with the contact bump(s) in the upper and/or lower contact section(s) defining the uppermost and the lowermost positions of the spring tab upper and/or lower surfaces, respectively. Similarly to the connecting assembly of FIG. 4, in such case the lower contact section, possibly equipped with a contact bump, may be brought into contact with the first electrically conductive surface.

In the embodiment of FIG. 4, the first electrically conductive surface is substantially planar. Alternatively, it could have, for example, an elevated region beneath the spring tab. Then, to form a contact between the first electrically conductive surface and the lower contact section of the spring tab, it may be sufficient that the second electrically conductive surface forces the spring tab to an intermediate position only where the lower contact section does not reach the connecting element bottom level.

One of the first and the second electrically conductive surfaces in a connecting assembly such as that of FIG. 4 may be, for example, a chassis plate or display support plate of a mobile device assembly. In various mobile devices comprising a display, such chassis plate or display support plate may be included and arranged to support the display module from the back surface thereof. Such chassis or support plate may be made of, or coated by, some metal, wherein the plate may be used as an electrical ground to which other components or elements of the device may be connected, i.e. grounded. The other one of the first and the second electrically conductive surfaces may be, for example, a surface of a shielding can or a shielding cage forming a part of an electronic device. Such shielding can or cage may be arranged and configured to form a conductive shielding protecting component(s) located in the can or cage from coupling of external electromagnetic disturbances, for example, in radio frequencies.

In addition to or instead of grounding, a connecting assembly may also be configured for other purposes, such as signal path formation, for example, between an antenna and an electrical circuitry or a grounding metal surface. In general, a connecting assembly, such as that of FIG. 4 and modifications thereof, may be used for any purpose where galvanic connection between first and second electrically conductive surfaces is needed to connect those surfaces electrically.

With reference to FIG. 3, the spring tab 320 has a cross-sectional or side profile wherein the spring tab comprises an upper bend portion 326 where the spring tab bends downwards such that, when observed along the spring tab over the upper bend portion, there is first a rising section where the spring tab is directed upwards, and then a descending section where the spring tab is directed downwards. The uppermost point of the spring tab upper surface 321 lies at the upper bend portion. The upper contact section 322 is located in the upper bend portion of the spring tab. Similar upper bend portion is present in the spring tabs of the connecting elements of FIGS. 1, 2A, 2B, and 4 also, although not specifically marked in the drawings.

A spring tab of a connecting element may correspondingly have a cross-sectional profile wherein the spring tab comprises a lower bend portion where the spring tab bends upwards such that, when observed along the spring tab over the lower bend portion, there is first a descending section where the spring tab is directed downwards, and then a rising section where the spring is directed upwards. The lowermost point of the spring tab lower surface lies then at the lower bend portion, and the lower contact section may be located in the lower bend portion.

Further, a spring tab of a connecting element may have both an upper bend portion and a lower bend portion, and the upper contact section and the lower contact section may be located in the upper bend portion and the lower bend portion, respectively.

Figure 5A:
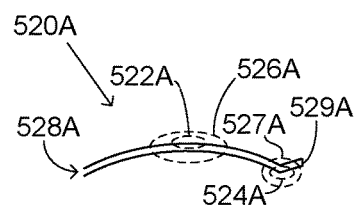
FIGS. 5A to 5C illustrate details of connecting elements.
Figure 5B:
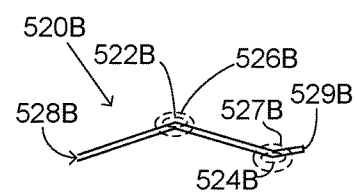
Figure 5C:
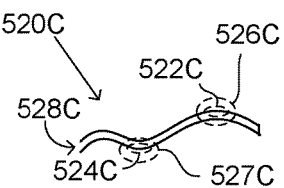

Examples of various spring tab cross-sectional profiles are illustrated in FIGS. 5A to 5C.

In FIG. 5A, a spring tab 520A having a profile with both an upper bend portion 526A and a lower bend portion 527A is shown. The upper bend portion 526A is formed as a continuously curved arch, whereas the lower bend portion 527A comprises a sharp, abrupt bend. In FIG. 5B, the spring tab 520B has a sharp, abrupt bend at the upper bend section 526B and at the lower bend portion 527B.

Similarly to the spring tabs of FIGS. 1, 2A, 2B, 3, and 4, the spring tabs 520A, 520B of FIGS. 5A and 5B have a first end 528A, 528B connecting the spring tab to the body plate (body plate not illustrated in FIGS. 5A and 5B), and a free second end 529A, 529B which is apart from the body plate. In the spring tabs 520A, 520B of FIGS. 5A, 5B, the upper bend portion 526A, 526B lies between the lower bend portion 527A, 527B, and the first end 528A, 528B of the spring tab. The upper contact section 522A, 522B and the lower contact section 524A, 524B are located in the upper bend portion 526A, 526B and in the lower bend portion 527A, 527B, respectively. Then, the upper contact section lies between the lower contact section and the first end of the spring tab.

An opposite arrangement is illustrated in FIG. 5C showing a spring tab 520C having a lower bend portion 527C with a lower contact section 524C located between the first end 528C of the spring tab and an upper bend portion 526C with an upper contact section 522C. The upper and the lower bend portions are formed as continuously curved arches.

In another embodiment, a connecting element may comprise a spring tab which has two ends which both are connected to the body plate so that there is no free end at all. Other details of such connecting element may be in accordance with any of the embodiments discussed above.

In all embodiments discussed above, there is one upper contact section and one lower contact section in the spring tab. In other embodiments, there may be several upper and/or lower contact sections in the spring tab. Then, the upper and the lower contact sections may alternate in a longitudinal direction of the spring tab.

The definitions "upper" and "lower", "top" and "bottom", "upwards" and "downwards", as well as "uppermost" and "lowermost" refer to opposite positions and directions in fictitious observation coordinates fixed relative to the connecting element itself. In these coordinates, a surface of the body plate, namely, the body plate lower surface designed to be positioned, when in use, against, on, or as facing towards a "first" electrically conductive surface, is the "lower" surface of the body plate. It defines the "bottom" side of the connecting element, and is directed "downwards". The opposite surface, namely, the body plate upper surface to be positioned, when in use in a connecting assembly, as facing towards a "second" electrically conductive surface which in turn faces towards the first electrically surface, is the "upper" surface of the body plate, defines the "top" side of the connecting element, and is directed "upwards". Thus, those directional and positional definitions are not fixed to any specific external coordinates such as those where the downwards direction refers to the direction of the gravity of Earth.

The directions and positions in said fictitious coordinates fixed relative to the connecting element itself shall be distinguished from the directions and positions of the different parts a connecting element relative to the direction of the gravity of Earth. When observed in coordinates fixed to the direction of the gravity of Earth or in any other external coordinates, the directions and positions of the connecting element and the parts thereof are changed when the connecting element is turned. Therefore, when observed in coordinates fixed to the direction of the gravity of Earth or any other external coordinates, the "lower", "upper", "bottom", "top", "downwards", and "upwards" may refer and be directed to any direction, depending on the instant position of the connecting element or a connecting assembly comprising the connecting element. For example, with relation to coordinates fixed to the direction of the Earth gravity so that the gravity force is directed "downwards", the connecting element may thus lie and be used in any direction, with those "upper" and "lower" surfaces and levels thus facing to any direction defined in such coordinates. This applies to assembling such connecting assembly also: a "first" electrically conductive surface against or on which the body plate is placed may be oriented in any direction in such external coordinates.

Those terms referring to opposite "up" and "down" positions or directions, and/or any derivatives of those terms (upper, uppermost, upwards, top; lower, lowermost, downwards, bottom) could be thus replaced by, for example, "first" and "second" positions or directions.

In the above, the general structure and cross-sectional profile of connecting elements and spring tabs thereof have been discussed. In the following, some aspects are discussed concerning the layout of connecting elements, i.e. the shape and structure of the connecting element in a plane along which the body plate extends and lies.

Figure 6:
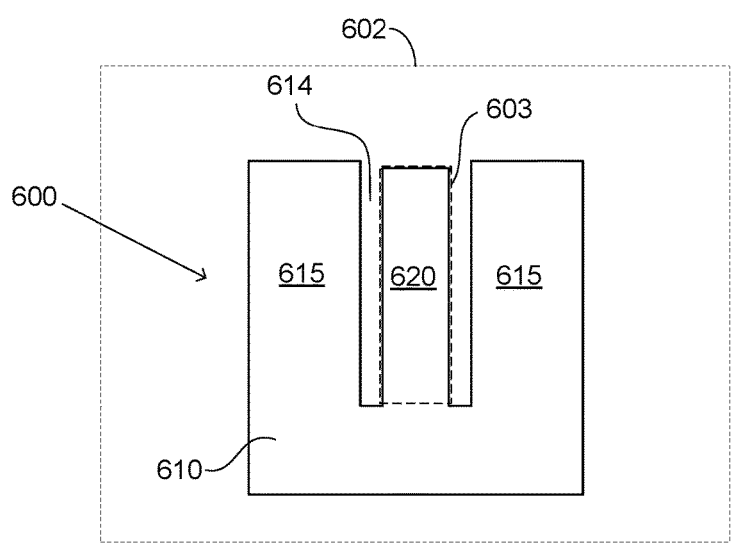
FIGS. 6 to 11 illustrate various layouts and structures of connecting elements.

FIG. 6 illustrates a connecting element 600, viewed from a direction perpendicular with a connecting element principal plane 602 along which the body plate extends. "Extending along" a plane refers to orientation of the body plate parallel to that plane. The connecting element 600 may be, for example, generally in accordance with any of the connecting elements of FIGS. 1, 2A, 2B, 3, and 4. Alternatively, it may have a spring tab in accordance with any of those of FIGS. 5A to 5C and the modifications thereof discussed above. The substantially planar body plate 610 has body plate lower and upper surfaces which are directed parallel to the connecting element principal plane.

The spring tab 620 has a spring tab projection 603 in the connection element principal plane 602, the spring tab projection falling outside the body plate 610, i.e. the body plate contour in the connecting element principal plane. In the drawing of FIG. 6, the spring tab projection is marked, for the sake of clarity, as slightly deviating from the spring tab contour. In reality, when viewed from a direction perpendicular with a connecting element principal plane 602, the contour of the spring tab projection coincides with the contour of the spring tab itself.

"Projection" refers to a footprint of the spring tab 620 in the connecting element principal plane 602. When observed the connecting element from a direction perpendicular with the connecting element principal plane, such footprint of projection is the area the spring tab covers in the connecting element principal plane.

Said falling of the spring tab projection 603 outside the body plate 610 allows the lower contact section (not illustrated in FIG. 6) to contact, with the spring tab in its compressed position, a surface on which the connecting element is attached when in use.

In the connecting element 600 of FIG. 6, the body plate 610 has a shape with a recess 614 which could be alternatively called, for example, a cavity, and the spring tab 620 has a shape resulting in that the spring tab projection 603 lies completely in the recess.

Figure 7:
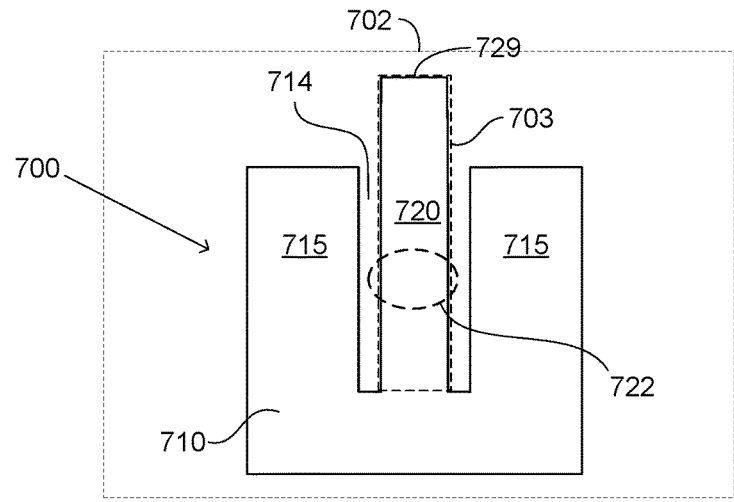

In an alternative embodiment illustrated in FIG. 7, the spring tab 720 has a shape making the spring tab projection 703 in the connecting element principal plane 702 lie only partially in the recess 714 of the body plate 710. The spring tab has a second free end 729, the part of the spring tab projection corresponding to the second free end lying outside the recess.

In the connecting element 700 of FIG. 7, the upper contact section 722 is located in a part of the spring tab which corresponds to the part of the spring tab projection which lies in the recess. This arrangement may provide a steady structure of the connecting element and secure assembly process of a connecting assembly where the connecting element in used.

In the connecting elements 600, 700 of FIGS. 6 and 7, the body plate 610, 710 has two supporting leg sections 615, 715 at opposite sides of the recess 614, 714.

Figure 8:
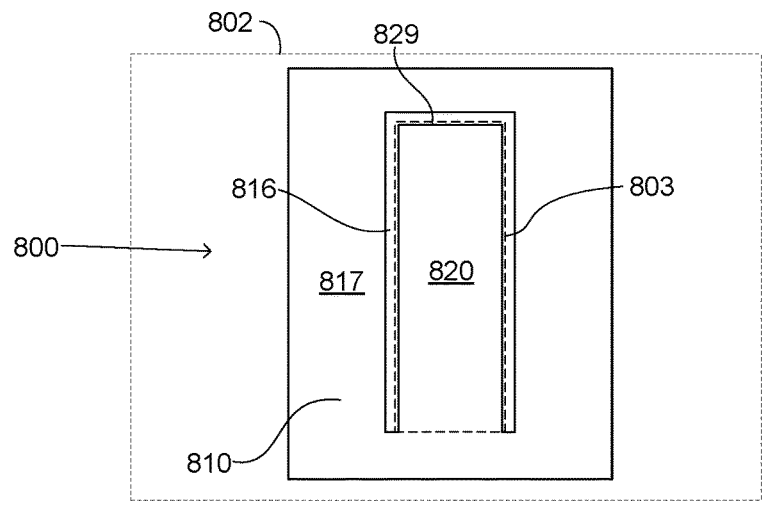

FIG. 8 illustrates another embodiment where the body plate 810 has a shape with an opening 816 and a circumferential part 817 enclosing the opening. In the embodiment illustrated in FIG. 8, the opening has a rectangular shape. In other embodiments, other shapes are possible. In this layout, the circumferential part 817 of the body plate 810 surrounds the spring tab projection 803 in the connecting element principal plane 802 from all directions. This kind of layout and configuration may protect the spring tab during handling and assembly by preventing unintentional contacts to the free second edge 829 of the spring tab 820.

Figure 9:
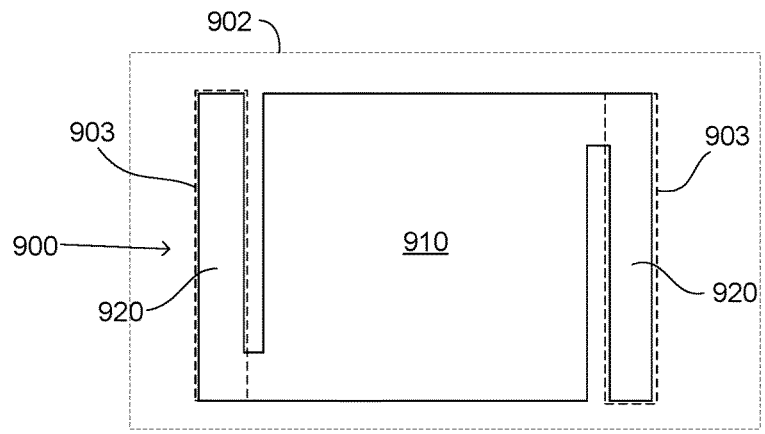

FIG. 9 illustrates yet another embodiment where the body plate 910 of the connecting element 900 has a rectangular shape without any specific recess or opening. Two spring tabs 920 extend from opposite corners of the body plate 910, the spring tab projections 903 in the connecting element principal plane 902 lying adjacent to two opposite sides of the body plate 910.

In the above embodiments of FIGS. 6 to 9, each spring tab projection falls substantially completely outside the body plate. In other embodiments, it may be sufficient that at least part of the spring tab projection falls outside the body plate. Falling of at least part of the projection "outside" the body plate refers to a location of the at least part the projection which does not coincide with any part of the body plate. For example, if the body part comprises a recess or opening, the at least part of the projection may lie in such recess or opening.

The extending of the lower contact section, with the spring tab in its compressed position, in or below the connecting element bottom level may be implemented by having the lower contact section located in a part of the spring tab corresponding to the at least part of the spring tab projection falling outside the body plate. Then, the lower contact section of the spring tab may contact, with the spring tab in its compressed position, a surface on which the connecting element is attached when in use.

Figure 10:
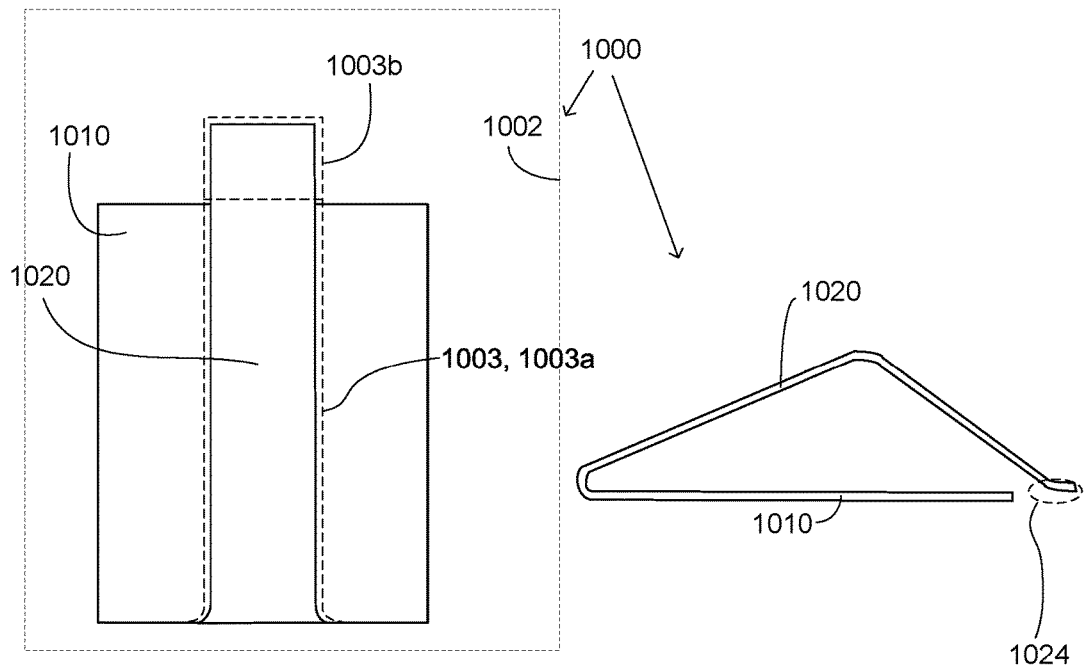

In an embodiment without necessary requirement for any recess or opening in the body plate, as illustrated in FIG. 10 as a top view and a side view, the overall structure of the connecting element 1000 may be folded so that a first part 1003*a* of the projection 1003 of the spring tab 1020 in the connecting element principal plane 1002 falls on the body plate 1010, and a second part 1003*b* thereof falls outside the body plate. With the lower contact section 1024 being located in a part of the spring tab corresponding to the second part of the projection, the same functionality of two-direction connections may be achieved as with any of the above embodiments.

Figure 11:
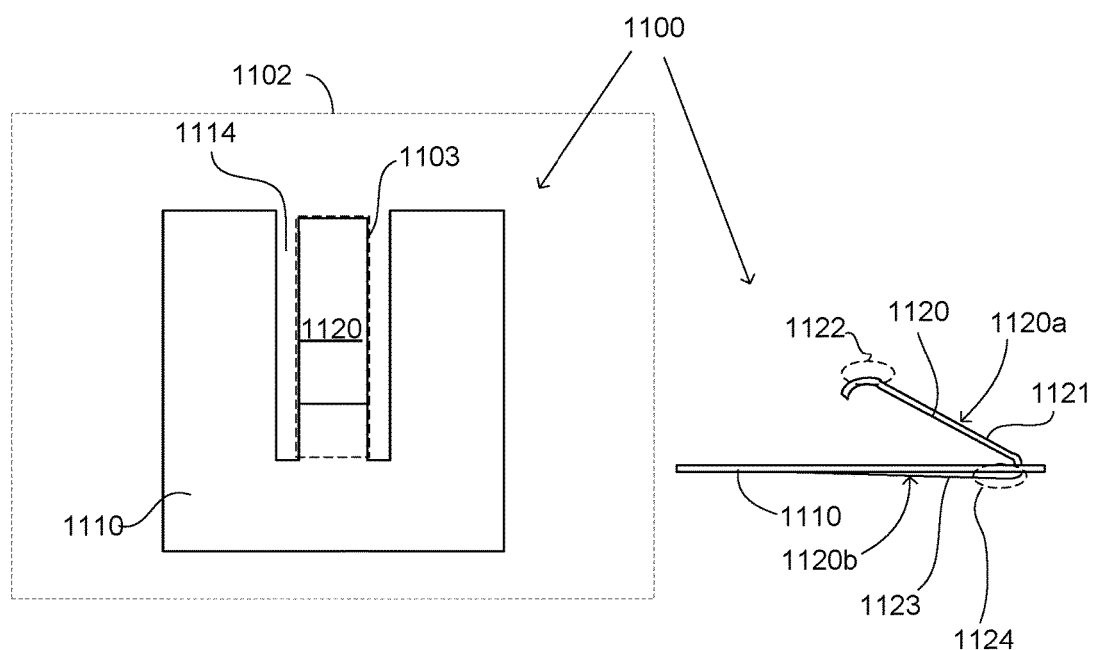

Another folded or bend structure is implemented in an embodiment illustrated in FIG. 11 as a top view and a side view. The spring tab 1120 of the connecting element 1100 is folded so that part of it is two-folded with an upper part 1120*a* thereof lying above a lower part 1120*a* thereof. Similarly to the embodiment of FIG. 6, the spring tab projection 1103 in the connecting element principal plane 1102 falls in a recess 1114 of the body plate 1110.

In the embodiment of FIG. 11, the same surface of the folded/bent spring tab forms the spring tab upper surface 1121 in the upper part 1120*a* of the spring tab, and the spring tab lower surface 1123 in the lower part 1120*b* of the spring tab. The lower contact section 1124 lies in the lower part of the spring tab, whereas the upper contact section 1122 lies in a part of the spring tab folded over said lower part thereof. The spring tab is illustrated in FIG. 11 in its compressed position.

In all connecting elements of FIGS. 1, 2A, 2B, 3, 4, and 6 to 11, the spring tab forms an elongated structure with two ends, one of which connects the spring tab to the body plate. This applies to the spring tabs of FIGS. 5A to 5C also. In other embodiments, spring tabs may have other types of shapes, for example, with a spring tab projection having a width greater than the length thereof.

In each of the connecting elements discussed above, the overall thickness of the connecting element may be selected according to the specific conditions of the intended application. For example, for connecting elements designed for grounding, connecting or shielding purposes in mobile electronic devices, such as smartphones or tablets typically having relatively thin overall structure, the overall thickness may be, for example, in the range of 0.5 to 5 mm. On the other hand, the lateral dimensions of the body plate may be selected to be sufficiently large in comparison to the overall thickness of the connecting element so that a steady structure, allowing secure assembling and contact formation, is achieved. For example, the width of the body plate may be at least double or triple the overall thickness of the connecting element. The connecting element may be made of relatively thin material, for example, of a metal plate having a thickness in the range of 0.2 to 0.5 or 0.1 to 1.0 mm.

In any of the embodiments discussed above, with the spring tab in its rest position, the lower contact section may lie, for example, at least 0.3 or 0.4 mm above the connecting element bottom. The upper limit depends, for example, on the overall thickness of the connecting element. In some other embodiments, the lower contact section may lie more clearly above the connecting element bottom level, for example, 0.5 to 1 or 0.5 to 3 mm above it. In some embodiments, which may be in accordance with any of the embodiments discussed above, the lower contact section may lie, for example, at the body plate top level or higher when the spring tab is in its rest position.

In the above embodiments, the connecting elements mainly have symmetric layouts with the spring tab positioned centrally relative to the body plate, or with two spring tabs located on opposite sides of the body plate. Also asymmetric layouts are possible where a spring tab is not positioned centrally relative to a body plate but lies, for example, along one side of the body plate. There may be then supporting or balancing extension(s) extending from the body plate main region so as to provide sufficient stability and rigidity for the connecting element.

Any of the connecting elements discussed above may be implemented as a part of a larger connecting element array where single connecting elements are repeated. The body plates and/or the spring tabs, depending on the layout and structure of the connecting element type, of such connecting elements may be connected to each other, possible releasably from each other. In the embodiment shown in FIG. 12, an array of connecting elements 1200 form one single common structure from which discrete connecting elements may be later cut off. Alternatively, an array of connecting elements may be used as such for forming a plurality of electrical connections.

Figure 12:
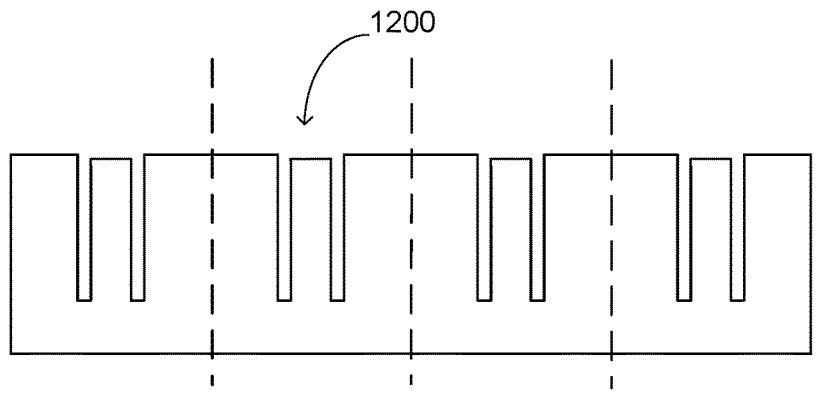
FIG. 12 illustrates an array of connecting elements.

The connecting elements 1200 of the array of FIG. 12 may be, for example, in accordance with the connecting element discussed above with reference to FIG. 6.

Figure 13:
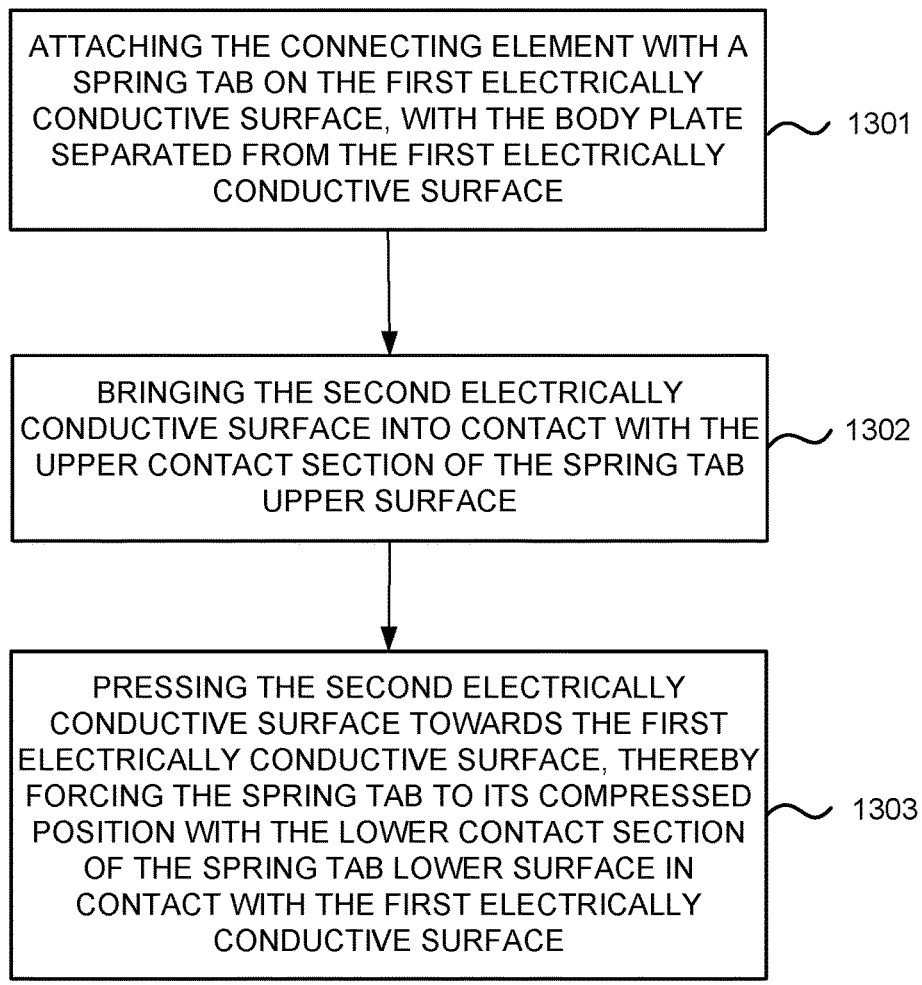
FIG. 13 illustrates a method of connecting two electrically conductive surfaces.

The method of FIG. 13 may be used for galvanically connecting a first and a second electrically conductive surface. Thereby a connecting assembly may be formed which may be in accordance of any of the connecting assemblies discussed above. The connecting element used in the method may be in accordance with any of the connecting elements discussed above, and the spring tab thereof may be in accordance with any of the spring tabs discussed above.

The method starts by attaching, in operation 1301, a connecting element with spring a tab on a first electrically conductive surface, with the body plate separated from the first electrically conductive surface by an interspace. Attachment may be made, for example, by an adhesive.

The configuration of the connecting element where, with the spring tab in its rest position, the lower contact section lies above the connecting element bottom level may allow accurate positioning and reliable attachment of the connecting element on the first electrically conductive surface. In its rest position, the spring tab applies no forces onto the first electrically conductive surface.

A second electrically conductive surface is brought into contact with the upper contact section of the spring tab of the connecting element in operation 1302.

In operation 1303, the second electrically conductive surface is pressed towards the first electrically conductive surface, thereby applying external force onto the upper contact section downwards, i.e. towards the connecting element bottom level, whereby the spring tab is forced to its compressed position and the lower contact section becomes into contact with the first electrically conductive surface.

In an alternative embodiment the first electrically conductive surface may have an elevated region located below the spring tab of the connecting element attached on the first electrically conductive surface. It may be then sufficient to press the second electrically conductive surface towards the connecting element bottom level until the spring tab is in an intermediate position where the lower contact section contacts the elevated region of the first electrically conductive surface, without forcing the spring tab down to its compressed position.

The method operations may be carried out at least partially automatically, using appropriate assembling apparatuses and systems.

Some embodiments are further discussed shortly in the following.

In a first aspect, a connecting element for galvanically connecting two electrically conductive surfaces, may comprise: a body plate having a body plate upper surface defining a body plate top level; and a spring tab extending from the body plate and having a spring tab upper surface comprising an upper contact section above the body plate top level; wherein the connecting element has a connecting element bottom level, and wherein the spring tab further has a spring tab lower surface comprising a lower contact section, the spring tab having a rest position in which, with no external force applied onto the upper contact section, the lower contact section lies above the connecting element bottom level, and being bendable, by applying external force onto the upper contact section towards the connecting element bottom level, to a compressed position in which the lower contact section lies in or below the connecting element bottom level.

The connecting element may be made, for example, of a metal plate having a thickness of 0.1 to 1.0 mm or 0.2 to 0.5 mm. The overall thickness of the connecting element with the spring tab and the body plate may be, for example, 0.5 to 5 mm. The body plate may have, for example, a width which is the same, at least double, or at least triple the overall thickness of the connecting element.

The spring tab may be made of any suitable electrically conductive material(s), such as a metal, for example, copper or aluminum. Another material example is spring steel. The spring tab may also be coated, for example, by gold or some other coating material suitable for forming galvanic connections between electrically conductive surfaces and the spring tab.

The body plate may be made of the same material as the spring tab.

The spring tab and the body plate may be formed as one single integral body.

The spring tab may have several upper and/or lower contact sections. For example, there may be two upper contact sections and one lower contact section between them, or vice versa, or a plurality of those both.

In an embodiment, the body plate has a body plate lower surface defining the connecting element bottom level.

In an embodiment where the body plate has a body plate lower surface, the connecting element further comprises an adhesive layer attached to the body plate lower surface to allow attachment of the connecting plate onto a conductive surface by the adhesive layer, the adhesive layer having a free lower surface defining the connecting element bottom level.

In an embodiment, which may be in accordance with any of the preceding embodiments, the spring tab comprises an upper bend portion in which the spring tab bends downwards, the upper contact section being located in the upper bend portion.

In an embodiment, which may be in accordance with any of the preceding embodiments, the spring tab comprises a lower bend portion in which the spring tab bends upwards, the lower contact section being located in the lower bend portion.

In an embodiment, which may be in accordance with any of the preceding embodiments, the spring tab comprises an upper bend portion and a lower bend portion in which the spring tab bends downwards and upwards, respectively, the upper contact section and the lower contact section being located in the upper bend portion and the lower bend portion, respectively.

The spring tab may comprise several upper and/or lower bend portions, each of which may have an upper/lower contact section.

In an embodiment, which may be in accordance with any of the preceding embodiments, the spring tab has a first end connecting the spring tab to the body plate and a free second end apart from the body plate.

In an embodiment which may be in accordance with the preceding embodiment, the upper contact section and the lower contact section are located with the upper contact section between the lower contact section and the first end of the spring tab. In an alternative embodiment, the upper contact section and the lower contact section are located with the lower contact section between the upper contact section and the first end of the spring tab.

In an embodiment, which may be in accordance with any of the preceding embodiments, at least one of the one or more upper contact section and the one or more lower contact section(s) comprises a contact bump.

In an embodiment, which may be in accordance with any of the preceding embodiments, the body plate extends along a connecting element principal plane, the spring tab having a spring tab projection in the connection element principal plane, at least part of the spring tab projection falling outside the body plate.

In an embodiment, which may be in accordance with the preceding embodiment, the body plate has a shape with a recess, and the at least part of the spring tab projection lies in the recess.

In an embodiment, which may be in accordance with the preceding embodiment, the upper contact section is located in a part of the spring tab corresponding to the at least part of the spring tab projection which lies in the recess.

In an embodiment, which may be in accordance with any of the two preceding embodiments, the body plate has two supporting leg sections at opposite sides of the recess.

In an embodiment, which may be in accordance with the embodiment above where the body plate extends along a connecting element principal plane, the spring tab having a spring tab projection in the connection element principal plane, at least part of it falling outside the body plate, the body plate has a shape with an opening and a circumferential part enclosing the opening, the at least part of the spring tab projection lying in the opening.

In a second aspect, a connecting assembly may comprise: a first electrically conductive surface; a second electrically conducting surface; and a connecting element comprising a body plate and a spring tab extending from the body plate, the body plate being attached on the first electrically conductive surface, separated therefrom by an interspace, the spring tab comprising an upper contact section and a lower contact section; wherein the second electrically conductive surface is located to contact the upper contact section and compress the spring tab so as to force the lower contact section to contact the first electrically conductive surface, whereby the spring tab forms a galvanic connection between the first conductive surface and the second conductive surface. The connecting element may be in accordance with any of the connecting elements of the first aspect discussed above.

In an embodiment of the connecting assembly, the body plate is attached on the first electrically conductive surface by an adhesive layer defining the interspace.

In an embodiment of the connecting assembly, which may be in accordance with the preceding embodiment, the first or the second electrically conductive surface is a surface of a display support plate of an electronic device having a display.

In an embodiment of the connecting assembly, which may be in accordance with any of the preceding connecting assembly embodiments, the second or the first conductive surface is a surface of a shielding can or a shielding cage forming a part of an electronic device.

In a third aspect, a method for connecting a first and a second electrically conductive surface galvanically may comprise: providing a connecting element, which may be in accordance with any of the connecting elements of the first aspect discussed above; attaching the connecting element on the first electrically conductive surface with the body plate separated from the first electrically conductive surface by an interspace; bringing the second electrically conductive surface into contact with the upper contact section of the spring tab upper surface; and pressing the second electrically conductive surface towards the first electrically conductive surface, thereby applying external force onto the upper contact section towards the connecting element bottom level, until the lower contact section becomes into contact with the first electrically conductive surface.

In an embodiment of the method, the connecting element is attached on the first electrically conductive surface by an adhesive. The adhesive may be applied onto the first electrically conductive surface and/or, when the body plate has a body plate lower surface, onto the body plate lower surface in advance, or the adhesive may be applied as a part of the method. The adhesive may be applied as an adhesive layer.

In any of the embodiments discussed above, with the spring tab in its rest position, the lower contact section may lie, for example, at least 0.3 or 0.4 mm above the connecting element bottom. The upper limit depends, for example, on the overall thickness of the connecting element. In some other embodiments, the lower contact section may lie more clearly above the connecting element bottom level, for example, 0.5 to 1 . . . 3 mm above it. In some embodiments, which may be in accordance with any of the embodiments discussed above, the lower contact section may lie, for example, at the body plate top level or higher Although some of the present embodiments may be described and illustrated as being implemented in a smartphone, a mobile phone, or a tablet computer, these are only examples of a device and not a limitation. As those skilled in the art will appreciate, the present embodiments are suitable for application in a variety of different types of devices, such as portable and mobile devices, for example, in lap upper computers, tablet computers, game consoles or game controllers, various wearable devices, etc.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The term "comprising" is used in this specification to mean including the feature(s) or act(s) followed thereafter, without excluding the presence of one or more additional features or acts.

The invention claimed is:

1. A connecting element for galvanically connecting two electrically conductive surfaces, comprising:
   a body plate having a body plate upper surface defining a body plate top level and a body plate lower surface defining a connecting element bottom level;
   a first spring tab extending from one corner of the body plate and having one end not connected to the body plate, and a second spring tab extending from an opposite corner of the body plate and having one end not connected to the body plate, each spring tab having a spring tab upper surface comprising an upper contact section above the body plate top level, each spring tab further having a spring tab lower surface comprising a lower contact section; and
   each spring tab having a rest position in which, with no external force applied onto the upper contact section, the lower contact section lies above the connecting element bottom level, and being bendable, by applying external force onto the upper contact section towards the connecting element bottom level, to a compressed position in which the lower contact section lies in or below the connecting element bottom level.

2. The connecting element as defined in claim 1, wherein the body plate has a body plate lower surface defining the connecting element bottom level.

3. The connecting element as defined in claim 1, wherein the body plate has a body plate lower surface, the connecting element further comprising an adhesive layer attached to the body plate lower surface to allow attachment of a connecting plate onto a conductive surface by the adhesive layer, the adhesive layer having a free lower surface defining the connecting element bottom level.

4. The connecting element as defined in claim 1, wherein each spring tab comprises an upper bend portion in which the spring tab bends downwards, the upper contact section being located in the upper bend portion.

5. The connecting element as defined in claim 1, wherein each spring tab comprises a lower bend portion in which the spring tab bends upwards, the lower contact section being located in the lower bend portion.

6. The connecting element as defined in claim 1, wherein each spring tab comprises an upper bend portion and a lower bend portion in which the spring tab bends downwards and upwards, respectively, the upper contact section and the lower contact section being located in the upper bend portion and the lower bend portion, respectively.

7. The connecting element as defined in claim 1, wherein each spring tab has a first end connecting the spring tab to the body plate and a free second end apart from the body plate.

8. The connecting element as defined in claim 7, wherein the upper contact section and the lower contact section are located with the upper contact section between the lower contact section and the first end of each spring tab.

9. The connecting element as defined in claim 1, wherein the body plate extends along a connecting element principal plane, each spring tab having a spring tab projection in the connection element principal plane, at least part of each spring tab projection falling outside the body plate.

10. The connecting element as defined in claim 9, wherein the body plate has a shape with a recess, and the at least part of each spring tab projection lies in the recess.

11. The connecting element as defined in claim 10, wherein the upper contact section is located in a part of each spring tab corresponding to the at least part of each spring tab projection lying in the recess.

12. The connecting element as defined in claim 10, wherein the body plate has two supporting leg sections at opposite sides of the recess.

13. The connecting element as defined in claim 9, wherein the body plate has a shape with an opening and a circumferential part enclosing the opening, the at least part of each spring tab projection lying in the opening.

14. A connecting assembly, comprising:
a first electrically conductive surface;
a second electrically conductive surface; and
a connecting element comprising a body plate having a first spring tab extending from one corner of the body plate and having one end not connected to the body plate and a second spring tab extending from an opposite corner of the body plate and having one end not connected to the body plate, the body plate being attached on the first electrically conductive surface, separated therefrom by an interspace, each spring tab comprising an upper contact section and a lower contact section, wherein at least one of the upper contact section and the lower contact section comprises a contact bump; and
wherein the second electrically conductive surface is located to contact the upper contact section and compress each spring tab so as to force the lower contact section to contact the first electrically conductive surface, whereby each spring tab forms a galvanic connection between the first electrically conductive surface and the second electrically conductive surface.

15. The connecting assembly as defined in claim 14, wherein the body plate is attached on the first electrically conductive surface by an adhesive layer defining the interspace.

16. The connecting assembly as defined in claim 14, wherein the first or the second electrically conductive surface is a surface of a display support plate of an electronic device having a display.

17. The connecting assembly as defined in claim 14, wherein the second or the first electrically conductive surface is a surface of a shielding can or a shielding cage forming a part of an electronic device.

18. A method for connecting a first and a second electrically conductive surface galvanically, comprising:
providing a connecting element, the connecting element comprising
a body plate having a body plate upper surface defining a body plate top level and
a body plate lower surface defining a connecting element bottom level; and
a first spring tab extending from one corner of the body plate and having one end not connected to the body plate, and a second spring tab extending from an opposite corner of the body plate and having one end not connected to the body plate, each spring tab having a spring tab upper surface comprising an upper contact section above the body plate top level, each spring tab further having a spring tab lower surface comprising a lower contact section, and wherein at least one of the upper contact section and the lower contact section comprises a contact bump;
each spring tab having a rest position in which, with no external force applied onto the upper contact section, the lower contact section lies above the connecting element bottom level, and being bendable, by applying external force onto the upper contact section towards the connecting element bottom level, to a compressed position in which the lower contact section lies in or below the connecting element bottom level;
attaching the connecting element on the first electrically conductive surface with the body plate separated from the first electrically conductive surface by an interspace;
bringing the second electrically conductive surface into contact with the upper contact section; and
pressing the second electrically conductive surface towards the first electrically conductive surface, thereby applying external force onto the upper contact section towards the connecting element bottom level, until the lower contact section becomes into contact with the first electrically conductive surface.

19. The method as defined in claim 18, wherein the connecting element is attached on the first electrically conductive surface by an adhesive.

\* \* \* \* \*